United States Patent
Johansson (10) Patent No.: US 12,487,404 B2
(45) Date of Patent: Dec. 2, 2025

(54) PATTERNING METHOD FOR PHOTONIC DEVICES

(71) Applicant: PSIQUANTUM CORPORATION, Palo Alto, CA (US)

(72) Inventor: Henrik Johansson, Wilton, NY (US)

(73) Assignee: PSIQUANTUM CORP., Palo Alto, CA (US)

(*) Notice: Subject to any disclaimer, the term of this patent is extended or adjusted under 35 U.S.C. 154(b) by 419 days.

(21) Appl. No.: 17/995,147

(22) PCT Filed: Mar. 30, 2021

(86) PCT No.: PCT/US2021/024772
§ 371 (c)(1),
(2) Date: Sep. 30, 2022

(87) PCT Pub. No.: WO2021/202445
PCT Pub. Date: Oct. 7, 2021

(65) Prior Publication Data
US 2023/0152520 A1  May 18, 2023

Related U.S. Application Data (60) Provisional application No. 63/002,957, filed on Mar. 31, 2020.

(51) Int. Cl.
G02B 6/136 (2006.01)
G02B 6/12 (2006.01)
H01L 21/311 (2006.01)

(52) U.S. Cl.
CPC ........ G02B 6/136 (2013.01); H01L 21/31122 (2013.01); H01L 21/31144 (2013.01);
(Continued)

(58) Field of Classification Search
CPC .......... G02B 6/136; G02B 2006/12176; G02B 2006/12047
See application file for complete search history.

(56) References Cited

U.S. PATENT DOCUMENTS 6,358,859 B1* 3/2002 Lo .................... H01L 21/3065
438/719
6,482,726 B1* 11/2002 Aminpur ........... H01L 21/28123
438/585
(Continued)

FOREIGN PATENT DOCUMENTS

CN        108519688 A     9/2018
DE  102009028256 B4 *  1/2019  ............. C30B 29/36
(Continued)

OTHER PUBLICATIONS

Wang, "Surface preparation techniques for biomedical applications", 2012, In Woodhead Publishing Series in Biomaterials, Coatings for Biomedical Applications, pp. 143-175 (Year: 2012).*
(Continued)

*Primary Examiner* — Thomas A Hollweg
*Assistant Examiner* — Kirsten D. Endresen
(74) *Attorney, Agent, or Firm* — THE MARBURY LAW GROUP PLLC (57) ABSTRACT

Methods and apparatus for etching a wafer. The wafer is positioned adjacent to a cathode within a vacuum chamber. The wafer includes a first layer stack, where the first layer stack includes a crystalline composition of a first element and a second element different from the first element. The crystalline composition may be BaTiO3 (BTO). A gas is received that includes a first partial gas and a second partial gas. The first and second partial gases may be HBr and Cl2, respectively. The gas is ionized, and the wafer is chemically etched by bombarding the layer stack with the ionized gas.
(Continued)

The chemical etching includes reacting the first partial gas with the first element and reacting the second partial gas with the second element.

11 Claims, 11 Drawing Sheets

(52) U.S. Cl.
CPC .............. *G02B 2006/12061* (2013.01); *G02B 2006/12097* (2013.01); *G02B 2006/12159* (2013.01); *G02B 2006/12176* (2013.01)

(56) References Cited

U.S. PATENT DOCUMENTS

| | | | |
|---|---|---|---|
| 7,151,277 B2* | 12/2006 | Gao | B81C 1/00595 257/51 |
| 2005/0121750 A1* | 6/2005 | Chan | H01L 29/6653 257/E29.152 |
| 2007/0187362 A1 | 8/2007 | Nakagawa et al. | |
| 2008/0253728 A1 | 10/2008 | Sparacin et al. | |
| 2010/0012944 A1* | 1/2010 | Cho | H01L 29/78675 438/151 |

FOREIGN PATENT DOCUMENTS

| | | |
|---|---|---|
| JP | 2003-257946 A | 9/2003 |
| JP | 2005115017 A | 4/2005 |
| KR | 2000-0003627 A | 1/2000 |
| KR | 100795662 B1 | 1/2008 |

OTHER PUBLICATIONS

Abel et al., "A Hybrid Barium Titanate-Silicon Photonics Platform for Ultraefficient Electro-Optic Tuning", Journal of Lightwave Technology, vol. 34, No. 8, 2016, pp. 1688-1693 (Year: 2016).*
Cardenas et al. "Optical nonlinearities in high-confinement silicon carbide waveguides", Optics Letters, 2015, pp. 4138-4140 (Year: 2015).*
Taiwan Intellectual Property Office, Office Action and Search Report for ROC (Taiwan) Patent Application No. 110111683, mailed Oct. 15, 2024, 7 pages.
Notification Concerning Transmittal of International Preliminary Report on Patentability and Written Opinion of the International Searching Authority for for International Search Report for International Patent Application No. PCT/US2021/024772, mailed Oct. 13, 2022, 6 pages.
Notification of Transmittal of International Search Report and Written Opinion of the International Searching Authority for International Patent Application No. PCT/US2021/024772, mailed Jul. 19, 2021, 10 pages.
Abel, S. et al, "A Hybrid Barium Titanate—Silicon Photonics Platform for Ultraefficient Electro-Optic Tuning," Journal of Lightwave Technology, vol. 34, No. 8, pp. 1688-1693, Dec. 17, 2015 [retrieved on Jun. 25, 2021]. Retrieved from <https://doi.org/10.1109/JLT.2015.2510282>.
Acharya, S. et al, "Self-limiting atomic layer deposition of barium oxide and barium titanate thin films using a novel pyrrole based precursor," Journal of Materials Chemistry C, 2016, vol. 4, pp. 1945-1952, Dec. 22, 2015 [retrieved on Jun. 25, 2021]. Retrieved from <https://doi.org/10.1039/c5tc03561a>.
Cunge, G. et al, "Ion flux composition in HBr/Cl2/O2 and HBr/Cl2/O2/CF4 chemistries during silicon etching in industrial high-density plasmas," Journal of Vacuum Science & Technology B: Microelectronics and Nanometer Structures Processing, Measurement, and Phenomena, vol. 20, No. 5, pp. 2137-2148, Oct. 4, 2002 [retrieved on Jun. 25, 2021]. Retrieved from <https://doi.org/10.1116/1.1511219>.
European Patent Office, Extended and Supplementary European Search Report for European Patent Application No. 21779672, mailed Sep. 4, 12 pages.
Kim, G.H. et al., "Etching characteristic and mechanism of BST thin films using inductively coupled Cl2/Ar plasma with additive CF4 gas," Thin Solid Films, vol. 459, Issues 1-2 pp. 127-130, ISSN 0040-6090, (2004), https://doi.org/10.1016/j.tsf.2003.12.115.
Messner, A. et al., "Plasmonic Ferroelectric Modulators," in Journal of Lightwave Technology, vol. 37, No. 2, pp. 281-290, 15 Jan. 15, 2019, doi: 10.1109/JLT.2018.2881332.
Abel, S. et al, "A Hybrid Barium Titanate—Silicon Photonics Platform for Ultraefficient Electro-Optic Tuning," Journal of Lightwave Technology, vol. 34, No. 8, pp. 1688-1693, DOI: 10.1109/JLT.2015.2510282.
JPO Office Communication, Notification of Reasons for Rejection for Japanese Patent Application No. 2022-560315, dispatched on Dec. 24, 2024, 10 pages, including English language translation.
JPO Office Communication, Final Notification of Reasons for Rejection for Japanese Patent Application No. 2022-560315, dispatched on May 20, 2025, 6 pages.

* cited by examiner

PATTERNING METHOD FOR PHOTONIC DEVICES

TECHNICAL FIELD

Embodiments herein relate generally to etching components of electro-optic devices such as phase shifters and switches.

BACKGROUND

Electro-optic (EO) modulators and switches have been used in optical fields. Some EO modulators utilize free-carrier electro-refraction, free-carrier electro-absorption, the Pockel's effect, or the DC Kerr effect to modify optical properties during operation, for example, to change the phase of light propagating through the EO modulator or switch. As an example, optical phase modulators can be used in integrated optics systems, waveguide structures, and integrated optoelectronics.

Despite the progress made in the field of EO modulators and switches, there is a need in the art for improved methods and systems related to pattering and etching wafer stacks for use in EO modulators and switches.

SUMMARY

Some embodiments described herein relate to apparatus and methods for etching a wafer to construct an electro-optical component.

In some embodiments, the wafer is positioned adjacent to a cathode within a vacuum chamber. The wafer may include a first layer stack, where the first layer stack includes a crystalline composition of a first element and a second element different from the first element. The crystalline composition may be $BaTiO_3$ (BTO).

A gas may be received that includes a first partial gas and a second partial gas. The first and second partial gases may be HBr and $Cl_2$, respectively. The gas is ionized, and the wafer is chemically etched by bombarding the layer stack with the ionized gas. Said chemically etching may include reacting the first partial gas with the first element and reacting the second partial gas with the second element.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

For a better understanding of the various described embodiments, reference should be made to the Detailed Description below, in conjunction with the following drawings in which like reference numerals refer to corresponding parts throughout the Figures.

While the features described herein may be susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first electrode layer could be termed a second electrode layer, and, similarly, a second electrode layer could be termed a first electrode layer, without departing from the scope of the various described embodiments. The first electrode layer and the second electrode layer are both electrode layers, but they are not the same electrode layer.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

Electro-Optical Devices

Embodiments of the present invention relate etching and patterning methods for constructing components of optical systems. Merely by way of example, embodiments of the present invention are provided in the context of integrated optical systems that include active optical devices, but the invention is not limited to this example and has wide applicability to a variety of optical and optoelectronic systems.

According to some embodiments, the active photonic devices described herein utilize electro-optic effects, such as free carrier induced refractive index variation in semiconductors, the Pockels effect, and/or the DC Kerr effect to implement modulation and/or switching of optical signals. Thus, embodiments of the present invention are applicable to both modulators, in which the transmitted light is modulated either ON or OFF, or light is modulated with a partial change in transmission percentage, as well as optical switches, in which the transmitted light is output on a first output (e.g., waveguide) or a second output (e.g., waveguide) or an optical switch with more than two outputs, as well as more than one input. Thus, embodiments of the present invention are applicable to a variety of designs including an M (input)×N (output) systems that utilize the methods, devices, and techniques discussed herein. Some embodiments also relate to electro-optic phase shifter devices, also referred to herein as phase adjustment sections, that may be employed within switches or modulators.

Figure 1:
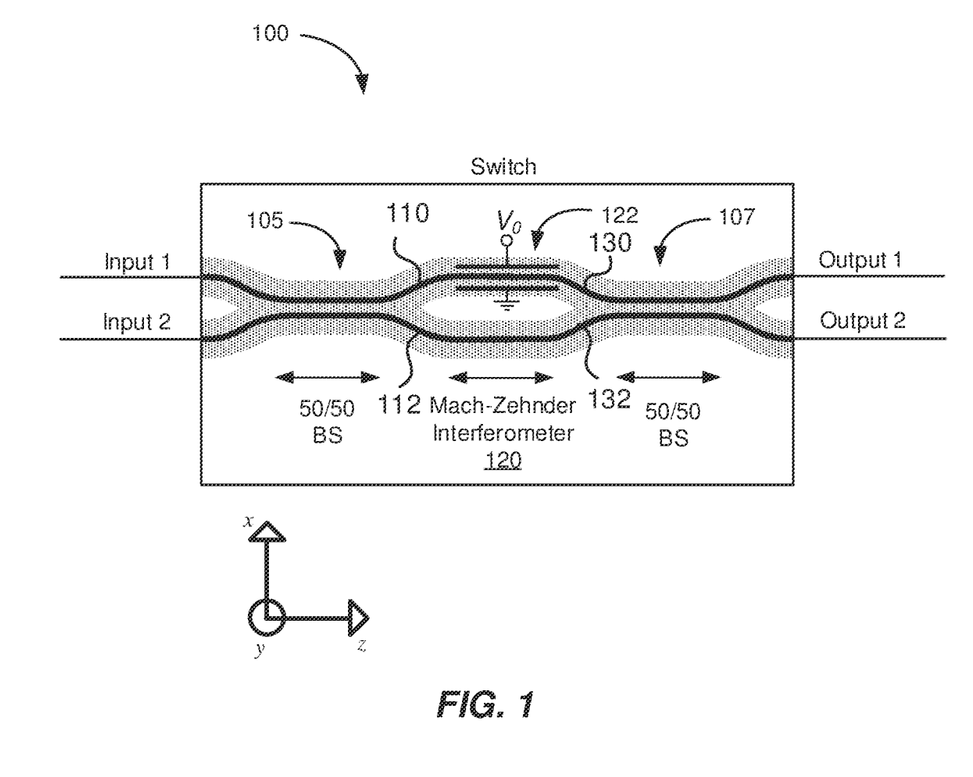
FIG. 1 is a simplified schematic diagram illustrating an optical switch according to some embodiments.

FIG. 1 is a simplified schematic diagram illustrating an optical switch according to an embodiment of the present invention. Referring to FIG. 1, switch 100 includes two inputs: Input 1 and Input 2 as well as two outputs: Output 1 and Output 2. As an example, the inputs and outputs of switch 100 can be implemented as optical waveguides operable to support single mode or multimode optical beams. As an example, switch 100 can be implemented as a Mach-Zehnder interferometer integrated with a set of 50/50 beam splitters 105 and 107, respectively. As illustrated in FIG. 1, Input 1 and Input 2 are optically coupled to a first 50/50 beam splitter 105, also referred to as a directional coupler, which receives light from the Input 1 or Input 2 and, through evanescent coupling in the 50/50 beam splitter, directs 50% of the input light from Input 1 into waveguide 110 and 50% of the input light from Input 1 into waveguide 112. Concurrently, first 50/50 beam splitter 105 directs 50% of the input light from Input 2 into waveguide 110 and 50% of the input light from Input 2 into waveguide 112. Considering only input light from Input 1, the input light is split evenly between waveguides 110 and 112.

Mach-Zehnder interferometer 120 includes phase adjustment section 122. Voltage $V_0$ can be applied across the waveguide in phase adjustment section 122 such that it can have an index of refraction in phase adjustment section 122 that is controllably varied. Because light in waveguides 110 and 112 still have a well-defined phase relationship (e.g., they may be in-phase, 180° out-of-phase, etc.) after propagation through the first 50/50 beam splitter 105, phase adjustment in phase adjustment section 122 can introduce a predetermined phase difference between the light propagating in waveguides 130 and 132. As will be evident to one of skill in the art, the phase relationship between the light propagating in waveguides 130 and 132 can result in output light being present at Output 1 (e.g., light beams are in-phase) or Output 2 (e.g., light beams are out of phase), thereby providing switch functionality as light is directed to Output 1 or Output 2 as a function of the voltage $V_0$ applied at the phase adjustments section 122. Although a single active arm is illustrated in FIG. 1, it will be appreciated that both arms of the Mach-Zehnder interferometer can include phase adjustment sections.

As illustrated in FIG. 1, electro-optic switch technologies, in comparison to all-optical switch technologies, utilize the application of the electrical bias (e.g., $V_0$ in FIG. 1) across the active region of the switch to produce optical variation. The electric field and/or current that results from application of this voltage bias results in changes in one or more optical properties of the active region, such as the index of refraction or absorbance.

Although a Mach-Zehnder interferometer implementation is illustrated in FIG. 1, embodiments of the present invention are not limited to this particular switch architecture and other phase adjustment devices are included within the scope of the present invention, including ring resonator designs, Mach-Zehnder modulators, generalized Mach-Zehnder modulators, and the like. One of ordinary skill in the art would recognize many variations, modifications, and alternatives.

Figure 2:
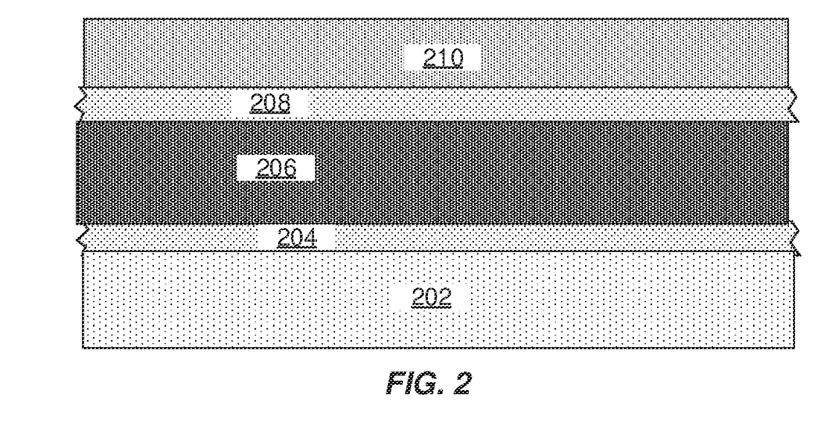
FIG. 2 is a schematic diagram of a pre-fabricated wafer comprising stacked layers, according to some embodiments.

The optical switch illustrated in FIG. 1 may include a waveguide structure that has been patterned from a wafer. FIG. 2 illustrates an example wafer that may be received from a wafer manufacturer and etched according to embodiments described herein, to produce the waveguide structure. FIG. 2 illustrates a cross section of a first wafer including a layer stack that may be received as part of a fabrication process for various devices described herein, according to various embodiments. As illustrated, a first insulating substrate layer (202) may be (optionally) disposed beneath a seed layer (204), which is disposed beneath an electro-optic layer (206), which is (optionally) disposed beneath an electrode layer (208), which is (optionally) disposed beneath a second insulating substrate layer (210). Alternatively, the electrode layer (208) may be located between the electro-optic layer (206) and the first insulating substrate layer (202). While FIG. 2 illustrates that each of the five layers 202-210 are present, any one or more of these layers may be absent, in various embodiments. In other words, the first wafer may be of various types depending on the specific fabrication method to be employed, and the seed layer, electrode layer, and second substrate layer may be optionally present or not present, as desired. One or more of the layers illustrated in FIG. 2 may be chemically etched to produce an electro-optical component, according to embodiments described herein.

Each of the layers of the wafer may be of any of a variety of types of materials. For example, the electrode layer 208 may be composed of a conducting material such as a metal, or alternatively they may be composed of a semiconductor material. In various embodiments, the electrode layer is composed of one of gallium arsenide (GaAs), an aluminum gallium arsenide (AlGaAs)/GaAs heterostructure, an indium gallium arsenide (InGaAs)/GaAs heterostructure, zinc oxide (ZnO), zinc sulfide (ZnS), indium oxide (InO), doped silicon, strontium titanate (STO), doped STO, barium titanate (BTO), barium strontium titanate (BST), hafnium oxide, lithium niobite, zirconium oxide, titanium oxide, graphene oxide, tantalum oxide, lead zirconium titanate (PZT), lead lanthanum zirconium titanate (PLZT), strontium barium niobate (SBN), aluminum oxide, aluminum oxide, doped variants or solid solutions thereof, or a two-dimensional electron gas. For embodiments where the electrode layer is composed of doped STO, the STO may be either niobium doped or lanthanum doped, or include vacancies, according to various embodiments.

In various embodiments, the electro-optic layer 206 is composed of one or strontium titanate (STO), barium titanate (BTO), barium strontium titanate (BST), hafnium oxide, lithium niobite, zirconium oxide, titanium oxide, graphene oxide, tantalum oxide, lead zirconium titanate (PZT), lead lanthanum zirconium titanate (PLZT), strontium barium niobate (SBN), aluminum oxide, aluminum oxide, or doped variants or solid solutions thereof. The electro-optic layer may be composed of a transparent material having an index of refraction that is larger than an index of refraction of the first and second insulating substrate layers, in some embodiments.

Figure 3A:
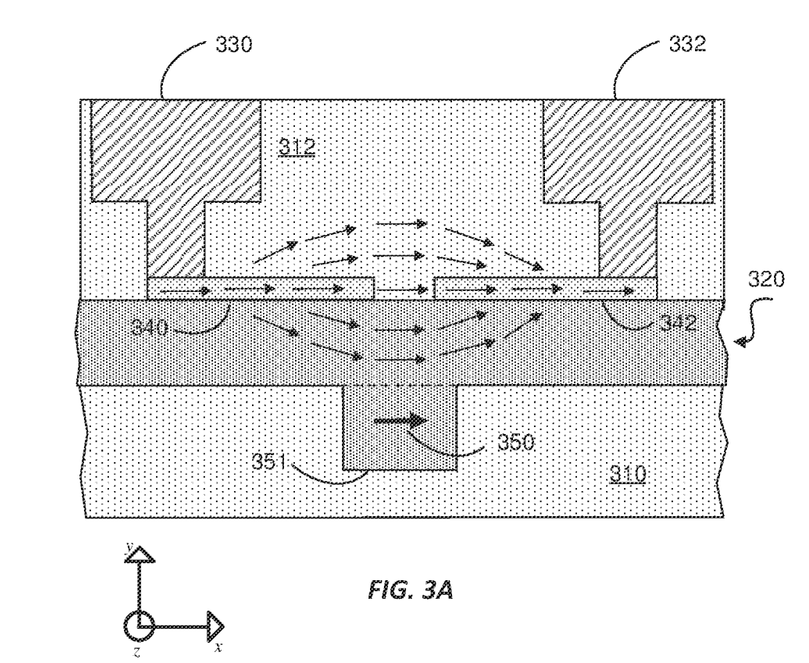
FIG. 3A is a simplified schematic diagram illustrating a cross section of a waveguide structure that shows the direction of an induced electric field, according to some embodiments.

FIG. 3A—Induced Electric Field in a Photonic Phase Shifter

FIG. 3A is a simplified schematic diagram illustrating a cross section of an example completed waveguide structure, where the direction of the induced electric field is illustrated with arrows, according to some embodiments. The waveguide structure illustrated in FIG. 3A may be fabricated from the wafer illustrated in FIG. 2 by performing etching techniques of embodiments described herein. FIG. 3A exhibits two electrical contacts, and each electrical contact includes a lead (330 and 332) connected to an electrode (340 and 342). It is noted that, as used herein, the term "electrode" refers to a device component that directly couples to the waveguide structure (e.g., to alter the voltage drop across the waveguide structure and actuate a photonic switch). Further, the term "lead" refers to a backend structure that couples the electrodes to other components of the device (e.g., the leads may couple the electrodes to a controllable voltage source), but the leads are isolated from and do not directly couple to the waveguide structure. In some embodiments, the leads may be composed of a metal (e.g., copper, gold, etc.), or alternatively, a semiconductor material.

As illustrated, FIG. 3A exhibits a photonic device comprising first and second cladding layers, 310 and 312, on either side of the waveguide. It is noted that the terms "first" and "second" are meant simply to distinguish between the two cladding layers, and, for example, the term "first cladding layer" may refer to the cladding layer on either side of the waveguide.

FIG. 3A further exhibits a slab layer (320) comprising a first material, wherein the slab layer is coupled to the first electrode of the first electrical contact and the second electrode of the second electrical contact. In some embodiments, the waveguide structure further includes a ridge portion (351) composed of the first material (or a different material) and coupled to the slab layer, where the ridge portion is disposed between the first electrical contact and the second electrical contact.

As illustrated in FIG. 3A, the small arrows show the induced electric field direction which generally points along the positive x-direction through the electrodes of the device. The electric field curves in a convex manner both above and below the electrodes, as illustrated. Furthermore, the large arrow (350) pointing in the positive x-direction illustrates the direction of polarization of an optical mode that may travel through the slab layer and the waveguide.

Figure 3B:
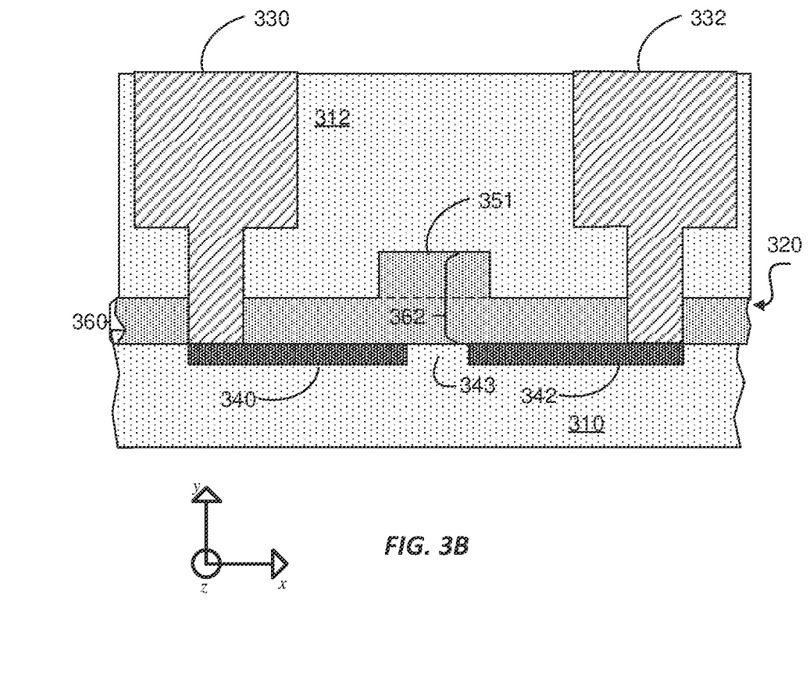
FIG. 3B is a simplified schematic diagram illustrating a cross section of a waveguide structure according to an alternative embodiment.

FIG. 3B illustrates an architecture where the ridge portion of the waveguide structure (351) is disposed on the top side of the slab layer and extends into a first cladding layer (312), the first electrode and the second electrode are coupled to the slab layer on the bottom side of the slab layer opposite the top side. As illustrated, the combination of the ridge portion and the slab layer has a first thickness (362) greater than a second thickness (360) of the slab layer alone (320), and the excess of the first thickness relative to the second thickness extends into the first cladding layer (312) on the top side of the slab layer (320). As illustrated in FIG. 3B, the first electrode (340) and the second electrode (342) are coupled to the slab layer (320) on the bottom side of the slab layer opposite the top side. Further, the first electrical contact (330) is coupled to the first electrode (340) by penetrating through the slab layer (320) from the top side of the slab layer to the bottom side of the slab layer, and the second electrical contact (332) is coupled to the second electrode (342) by penetrating through the slab layer (320) from the top side of the slab layer to the bottom side of the slab layer.

Figure 4:
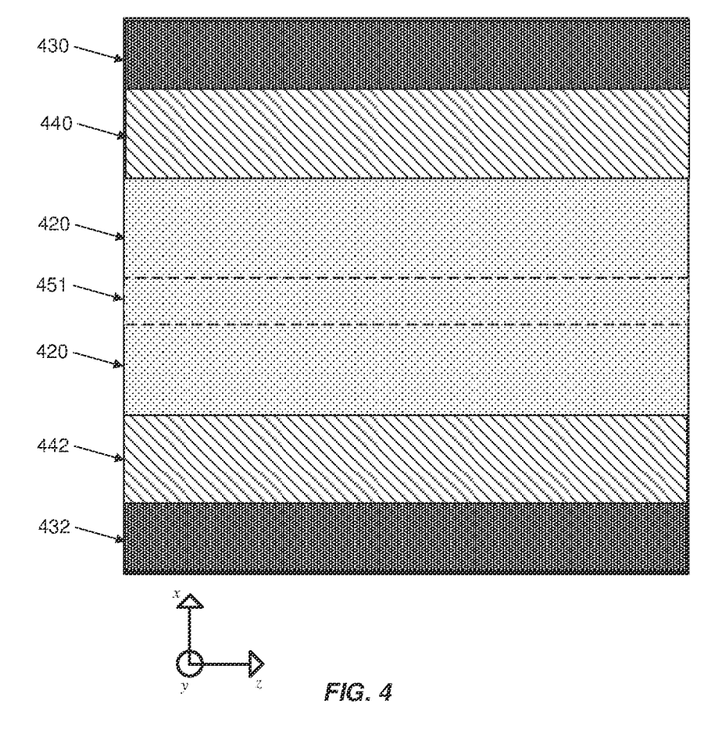
FIG. 4 is a simplified schematic diagram showing a top view of a waveguide structure, according to some embodiments.

FIG. 4—Top-Down View of Photonic Phase-Shifter

FIG. 4 is a top-down view of a photonic phase-shifter architecture of FIGS. 3A and 3B, which may be patterned according to embodiments described herein. As illustrated, the phase-shifter may include first (430) and second (432) leads, first (440) and second (442) electrodes, a slab (e.g., waveguide) layer (420), and a ridge portion of the waveguide structure (451).

Figure 5:
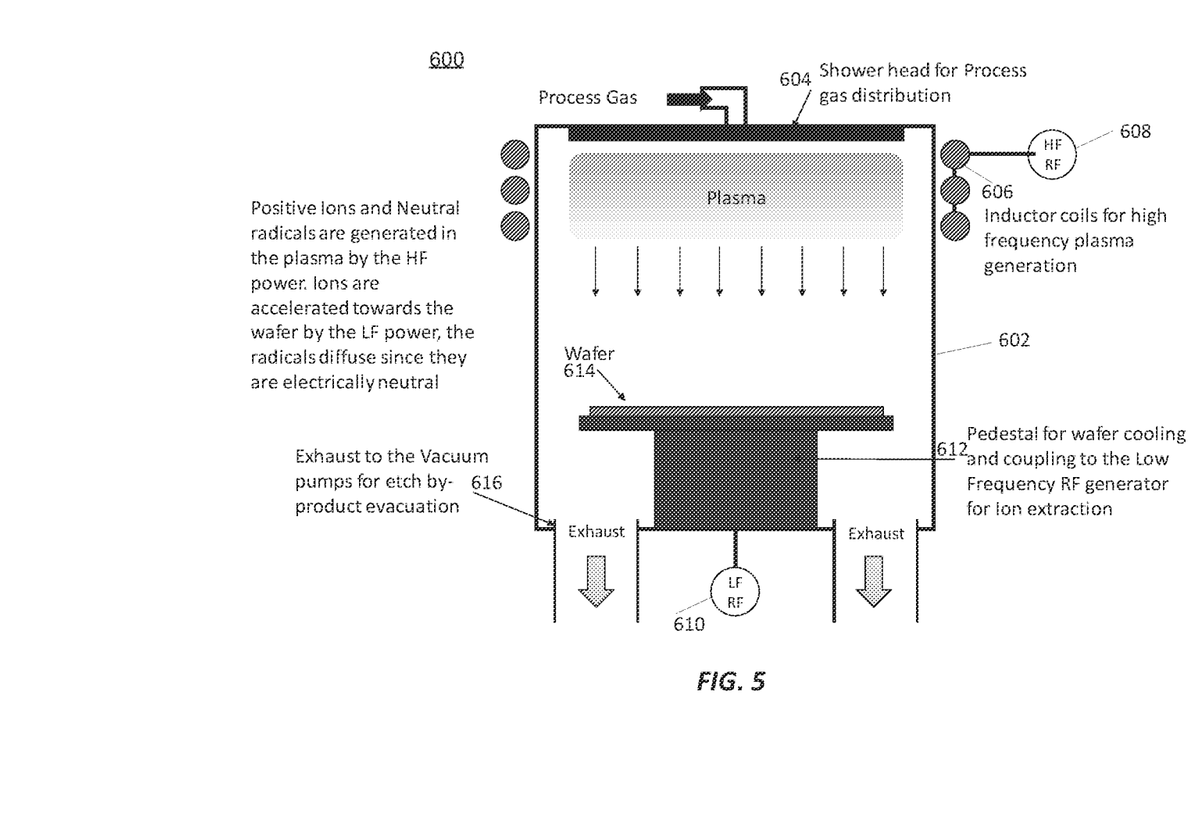
FIG. 5 is a schematic diagram of a wafer etching apparatus, according to some embodiments.

FIG. 5—Wafer Etching Apparatus

FIG. 5 is a schematic diagram illustrating a wafer etching apparatus (600), according to some embodiments. The illustrated wafer etching apparatus is one example of a wafer etching apparatus, but it is understood to be within the scope of the present disclosure to utilize various modified types of apparatus for performing the etching methods described herein. As illustrated, a process gas (e.g., a combination of HBr and $Cl_2$, among other possibilities) may be inserted through the top of the etching process chamber 602, and distributed over the top region of the chamber using a shower head 604. As illustrated, inductor coils 606 wrapped around the chamber 602 are connected to a high frequency (HF) radio frequency (RF) generator (e.g., a 60 MHz RF generator) 608 which is configured to introduce a rapidly oscillating magnetic field within the chamber 602. The induced oscillating field may interact with the process gas to ionize the gas. At the bottom of the chamber 602, a low frequency (LF) RF generator (e.g., typically a 13.5 MHz generator, or another frequency) 610 may be capacitively coupled to the pedestal 612 to introduce an oscillating capacitive charge on the top surface of the pedestal. This LF oscillating charge will accelerate ionized gas particles downward to collide with and chemically etch the wafer (e.g., the substrate containing one or more layers to be etched) 614 positioned on the pedestal 612. Finally, gaseous chemical by-products of the chemical etching reaction may be exhausted through a low-strength pump 616 at the bottom of the chamber 602.

BTO Patterning

Constructing the components of the electro-optical systems described above may involve an etching process to modify a wafer into an electro-optical component, such as a waveguide structure. Prior art methods for wafer etching exhibit limitations, and embodiments herein present improved methods for wafer etching.

Figure 6:
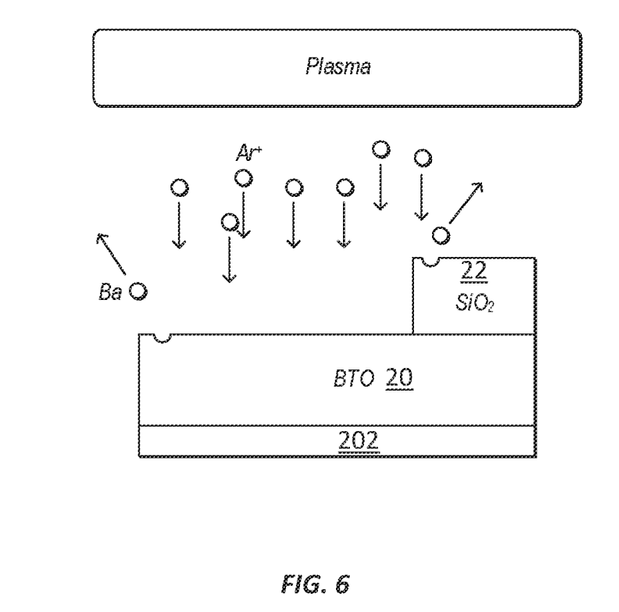
FIG. 6 is a schematic illustration of an ion milling etch procedure, according to the prior art.

FIG. 6 illustrates an ion milling method for etching $BaTiO_3$ (BTO), according to the prior art. BTO is a difficult material to pattern using Reactive Ion Etch (RIE), because BTO does not form volatile by-products with fluorine or chlorine, the halides commonly used in plasma etching. The chemical by-products of etching BTO using conventional fluorine and chlorine are non-volatile below approximately 1500° C. Accordingly, these by-products may not desorb from the wafer at the temperatures and pressures available in an RIE chamber. As a consequence, as illustrated in FIG. 6, some previous implementations for patterning a BTO layer 20 have been focused on ion-beam etching using Argon, a process that is slow and has no selectivity to the mask (e.g., a silicon oxide hard mask) 22. During ion milling, argon ions are accelerated towards the BTO surface and physically break off barium and titanium atoms. These atoms are then pumped out through the exhaust. However, the etched atoms may often redeposit elsewhere on the surface of the wafer, causing undesirable defects. In addition, ion milling is non-selective so that effectively utilizing a hard mask may require the hard mask 22 to be thicker than the desired patterning depth, leading to increased material costs and etching time.

Figure 7:
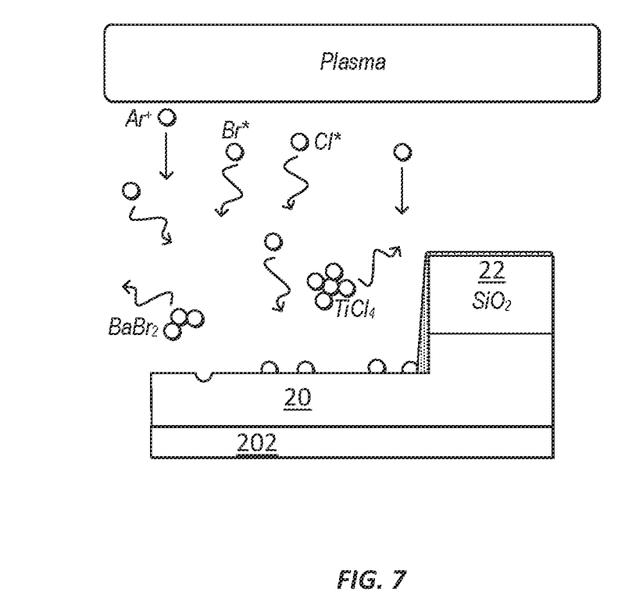
FIG. 7 is a schematic illustration of using ionized partial gas mixture to etch an electro-optic layer, according to some embodiments.

To address these and other concerns, embodiments herein propose a method where the BTO layer 20 is etched using a mixture of Hydrogen Bromide (HBr) and Chlorine ($Cl_2$) to form the volatile by-products $BaBr_2$ and $TiCl_4$, respectively. As illustrated in FIG. 7, a partial gas mixture of HBr and $Cl_2$ is ionized, and this ionized gas is used to etch BTO. $BaBr_2$ becomes volatile at 120° C. at 1 atm pressure which is well within reach of conventional RIE chambers. In various embodiments, in order to pattern the wafer, several integration schemes with $SiO_2$ or $Si_3N_4$ hard masks 22, 24 may be used, as both materials are compatible with HBr/$Cl_2$ containing chemistries.

In some embodiments, formation of $BaBr_2$ may be assisted by the presence of oxygen, hydrogen, and/or argon ions in the plasma. The oxygen, hydrogen, and/or argon ions may be accelerated towards the surface at lower energy compared to that used for ion milling. The Br and Cl radicals are electrically neutral and may diffuse to the wafer surface.

Both by-products readily desorb from the wafer surface and may be pumped out of the chamber without redepositing on the wafer.

Additional benefits are that the HBr/$Cl_2$ mixture is selective to $SiO_2$ or $Si_3N_4$ hard masks. The etch rate of BTO is also higher using a chemically assisted etch compared to a physical ion milling process and it has a lower risk of striations resulting in Line Edge Roughness (LER)

FIG. 8-11—Hard Mask Utilization

FIGS. 8-11 illustrate different methods for utilizing a hard mask when patterning an electro-optic layer, according to various embodiments.

Figure 8:
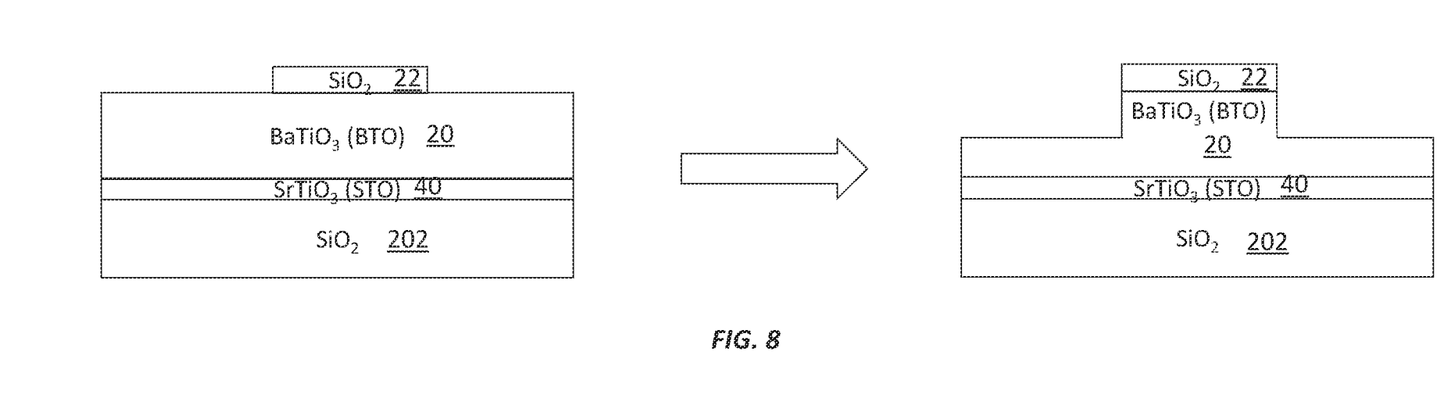
FIG. 8 is a schematic illustration of utilizing a thin $SiO_2$ hard mask to etch a wafer, according to some embodiments.

FIG. 8 illustrates utilization of a hard mask 22 of $SiO_2$ to pattern the BTO layer 20. In one embodiment, the BTO layer 20 may be used as the slab/ridge electrooptic layer 320 in the device of FIG. 3B. The $SiO_2$ hard mask 22 is selected because of the high selectivity to $SiO_2$ in HBr-based plasmas. The hard mask 22 may be patterned in a previous step. Optionally, an STO layer 40 may be located below the BTO layer 20. The STO layer 40 may be used to form the dielectric electrodes 340, 342 of FIG. 3B. The STO layer 40 may be patterned prior to forming the BTO layer 20 by any suitable method, such as ion milling. The optional STO layer 40 and the BTO layer 20 may be formed over the insulating substrate layer 202, such as a Silicon Dioxide or Silicon Nitride layer described above with respect to FIG. 2. The insulating substrate layer 202 may be a temporary layer which is subsequently removed or may be a retained in the final electro-optic device as a cladding layer. Furthermore, the seed layer 204 may optionally also be formed below the BTO layer 40 as described above. The seed layer 204 may subsequently be removed or retained in the final electro-optic device. As illustrated, the BTO layer 20 is etched using the HBr/$Cl_2$ chemistry. In addition to the two main etching gases, $O_2$ is added for selectivity to the $SiO_2$ hard mask 22 as well as for profile control and Argon is added to supply energy in the form of ion bombardment.

Figure 9:
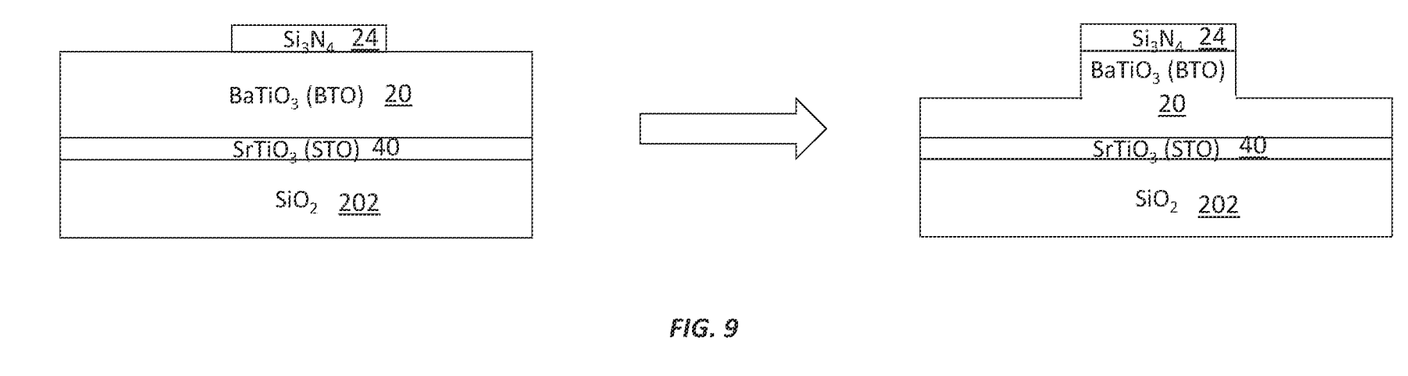
FIG. 9 is a schematic illustration of utilizing a thin $Si_3N_4$ hard mask to etch a wafer, according to some embodiments.

FIG. 9 illustrates utilizing a hard mask of Silicon Nitride ($Si_3N_4$) 24 to pattern the BTO layer 20. Silicon Nitride is similar to Silicon Dioxide in that it is difficult to etch with HBr which results in high selectivity similar to the $SiO_2$ hard mask 22 case, the BTO layer 20 is etched using HBr/$Cl_2$ chemistry. In addition to the two main etching gases, $O_2$ is added for profile control and Argon is added to supply energy in the form of Ion bombardment just as in the case of $SiO_2$ hard mask.

Figure 10:
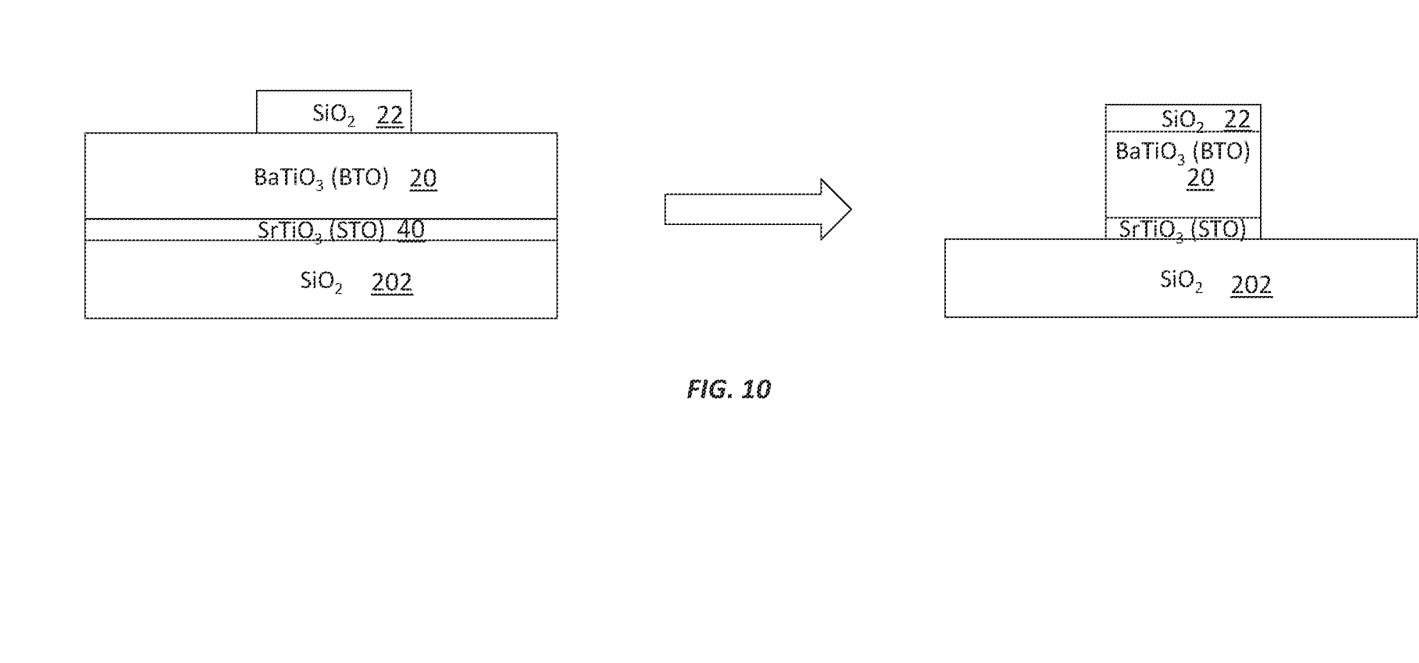
FIG. 10 is a schematic illustration of utilizing a thick $SiO_2$ hard mask to etch a wafer, according to some embodiments.

FIG. 10 illustrates a similar hard mask of $SiO_2$ 22 as shown in FIG. 8, which may be used to pattern the BTO layer 20 in some embodiments. The hard mask 22 is thicker than in FIG. 8 due to the increased etch depth. The BTO layer 20 and the STO layer 40 are etched together using the HBr/$Cl_2$ chemistry or by optionally using ion milling to etch the STO layer 40 after the BTO layer 20 is etched using the HBr/$Cl_2$ chemistry. In addition to the two main etching gases, $O_2$ is added for selectivity to the $SiO_2$ hard mask 22 as well as for profile control and Argon is added to supply energy in the form of ion bombardment. In this embodiment, the full BTO stack is etched and the process stops on the $SiO_2$ insulating substrate layer 202 underneath.

Figure 11:
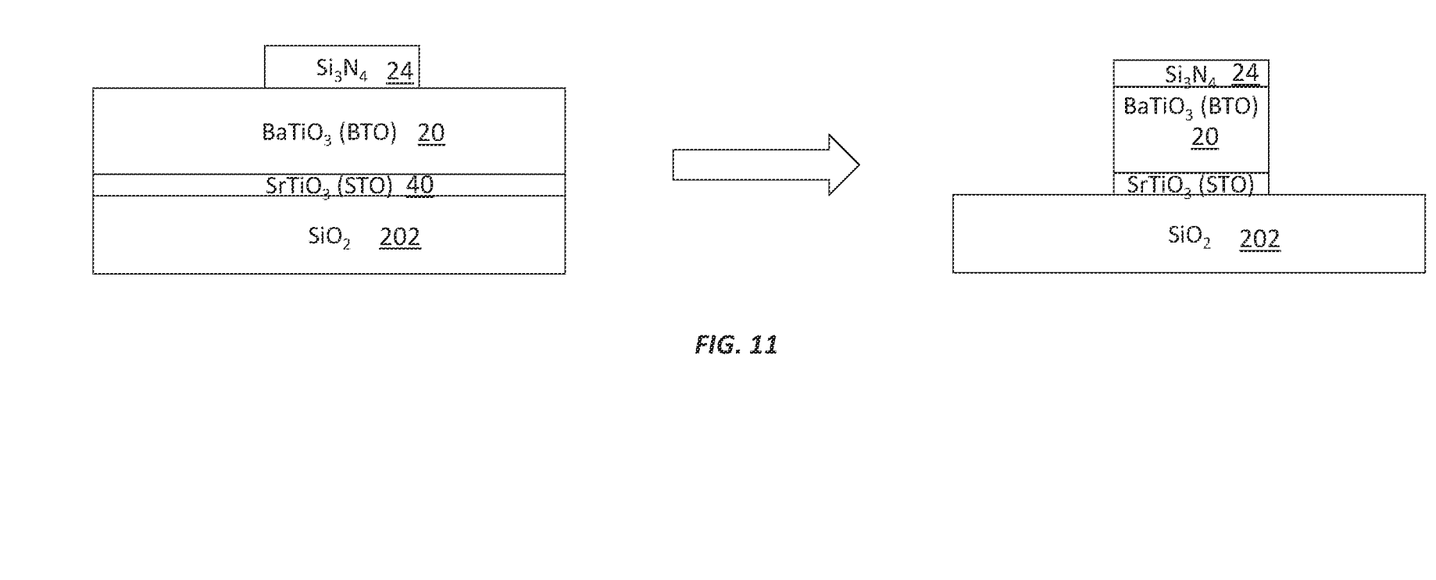
FIG. 11 is a schematic illustration of utilizing a thick $Si_3N_4$ hard mask to etch a wafer, according to some embodiments.

FIG. 11 illustrates a hard mask of $Si_3N_4$ 24, similar to that shown in FIG. 9, that may be used to pattern the BTO layer 40. The hard mask 24 is thicker than that shown in FIG. 9 to accommodate the increased etch depth. The BTO layer 20 and the STO layer 40 are etched together using the HBr/$Cl_2$ chemistry or by optionally using ion milling to etch the STO layer 40 after the BTO layer 20 is etched using the HBr/$Cl_2$ chemistry. In addition to the two main etching gases, $O_2$ is added for selectivity to the silicon nitride hard mask 22 as well as for profile control and Argon is added to supply energy in the form of ion bombardment. In this embodiment, the full BTO stack is etched and the process stops on the $SiO_2$ insulating substrate layer 202 underneath.

Embodiments described herein for BTO layer 40 etching present advantages over prior art methods, such as ion milling using argon ions mixed with fluorine. Since the by-products produced by embodiments herein readily desorb from the surface, the produced wafer (i.e., the insulating substrate layer 202 supporting the etched BTO layer 40) may exit the process chamber 602 shown in FIG. 5 with fewer defects compared to wafers produced with ion milling processes. Additionally, chemically assisted etching has a higher etch rate, resulting in shorter processing times. Further, etching methods described according to some embodiments may have more tunable parameters such as pressure, power and gas composition that allows for improved control of the process. Embodiments herein offer improved selectivity to the hard mask, simplifying process integration. Chemical etching methods described herein are less physical than ion milling, reducing the risk of striations and edge channeling that in turn causes line edge roughness, (LER).

In some embodiments, HBr may react with moisture from the air and redeposit on the wafer. This re-deposition is referred to as time-dependent haze and may be dissolved during wafer cleaning. In some embodiments, non-processed wafers may be physically separated from processed wafers. This may prevent the haze from depositing on the surface of unprocessed wafers and causing micro-masking.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for etching a wafer, comprising:
    positioning the wafer inside a plasma etching chamber, wherein the wafer comprises a layer of barium titanate (BTO);
    introducing a gas into the vacuum plasma etching chamber, wherein the gas comprises a mixture of hydrogen bromide (HBr) and chlorine ($Cl_2$);
    ionizing the HBr and the $Cl_2$ to produce an ionized gas; and
    etching the wafer by bombarding the layer of BTO with the ionized gas to pattern the layer of BTO.

2. The method of claim 1, the method further comprising pumping out desorbed by-products of a chemical reaction of the ionized gas with the layer of BTO.

3. The method of claim 2, wherein the desorbed by-products comprise barium bromide ($BaBr_2$) and titanium tetrachloride ($TiCl_4$), and wherein the layer of barium titanate consists essentially of barium, titanium and oxygen.

4. The method of claim 1, wherein the wafer further comprises a hard mask layer disposed on the layer of BTO, wherein the hard mask layer shields a portion of the layer of BTO from bombardment by the ionized gas.

5. The method of claim 4, wherein the hard mask comprises one of:
    silicon dioxide ($SiO_2$); or
    silicon nitride ($Si_3N_4$).

6. The method of claim 4, wherein:
    the wafer further comprises a substrate layer disposed on a side of the layer of BTO opposite the hard mask layer, and
    chemically etching the wafer comprises completely etching through a portion of the layer of BTO until the substrate layer is exposed.

7. The method of claim 6, wherein the substrate layer comprises one of:
    silicon dioxide ($SiO_2$); or
    silicon nitride ($Si_3N_4$).

8. The method of claim 1, wherein the gas further comprises oxygen gas ($O_2$).

9. The method of claim 1, wherein the gas further comprises argon (Ar).

10. The method of claim 1, wherein the layer of BTO comprises a waveguide layer of the electro-optic device.

11. The method of claim 10, wherein the layer of BTO comprises a slab/ridge waveguide layer and the electro-optic device comprises a Mach-Zehnder interferometer.

* * * * *